United States Patent [19]

Metoki

[11] Patent Number: 4,771,332
[45] Date of Patent: Sep. 13, 1988

[54] TUNING APPARATUS FOR THE VHF BAND OF A TELEVISION RECEIVER

[75] Inventor: Toshihiro Metoki, Fukaya, Japan

[73] Assignee: Kabushiki Kaisha Toshiba, Kawasaki, Japan

[21] Appl. No.: 87,793

[22] Filed: Aug. 21, 1987

[30] Foreign Application Priority Data

Aug. 22, 1986 [JP] Japan .................. 61-196603

[51] Int. Cl.$^4$ .................. H04N 5/455; H04B 1/18
[52] U.S. Cl. .................. 358/191.1; 455/180; 455/191
[58] Field of Search .................. 358/191.1, 195.1; 455/180, 188, 191, 195

[56] References Cited

U.S. PATENT DOCUMENTS

| 3,962,643 | 6/1976 | Ma | 455/180 |
| 4,298,290 | 9/1981 | Ijichi | 455/191 |
| 4,379,269 | 4/1983 | Ijichi | 358/191.1 |
| 4,612,571 | 9/1986 | Moon | 455/191 |

FOREIGN PATENT DOCUMENTS 55-21400 5/1980 Japan .

Primary Examiner—Tommy P. Chin
Attorney, Agent, or Firm—Cushman, Darby & Cushman

[57] ABSTRACT

A channel selection circuit selects signals of a desired frequency from television signals. A channel interpretation circuit determines whether or not the signals thus selected are low-band or high-band. When the signals are low-band, a movable contact is coupled to a D.C. power source. When the signals are high-band, the movable contact is coupled to the ground. A first trap circuit traps the intermediate-frequency components of the selected signals. A second trap circuit connected to the first trap circuit, and a third trap circuit coupled between the output of the second trap circuit and the group and also connected to the movable contact of a switch section, cooperate, thereby trapping predetermined signals. More specifically, when the movable contact is coupled to the D.C. power source, a semiconductor switching device is turned on, thus causing the second and third trap circuits to trap high-band signals and intermediate-frequency signals. When the movable contact is coupled to the ground, the switching device is turned off, thereby causing to the second and third trap circuits to perform the image-trapping of high-band signals and to trap low-band signals.

7 Claims, 3 Drawing Sheets

TUNING APPARATUS FOR THE VHF BAND OF A TELEVISION RECEIVER

BACKGROUND OF THE INVENTION

This invention relates to a tuning apparatus for use in a television apparatus, and more particularly, to a tuning apparatus for the VHF band of the television receiver.

Generally, television receivers have mechanical tuners or electronic synchronous tuners, which are used as a tuner for VHF (Very-High Frequency) band and a tuner for UHF (Ultra-High Frequency) band. Each of these tuners comprises an input tuning circuit, a high-frequency amplifier circuit, a mixer for providing intermediate-frequency television signals, and a local oscillating circuit.

An electronic synchronous tuner needs to be switched for a low band (e.g., 90 to 108 MHz) or a high band (e.g., 170 to 222 MHz), in accordance with the frequency of the television signals. Hence, in order to prevent undesired signal-mixing, a band trap circuit is provided within the input tuning circuit of the tuner. The band trap circuit functions as a high-band trap while the television receiver is receiving low-band television signals, and as a low-band trap while the television receiver is receiving high-band television signals.

Recently, there has been a demand for tuners which can receive cable television (CATV) signals. The frequency of the CATV signals is high. It is therefore necessary for the band trap circuit of such a tuner to receive low-band signals whose frequency range is broader and also high-band signals whose frequency range is broader. The band trap circuit of the type used in the electronic synchronous tuner designed for the ordinary television receivers cannot trap all signals of unnecessary frequencies. Hence, there has been an increasing demand that the tuners be improved, thereby to receive CATV signals as well as ordinary television signals.

SUMMARY OF THE INVENTION

Accordingly, it is an object of the invention to provide a tuning apparatus which can receive signals over a broad frequency band, without forfeiting the advantage of avoiding signal-mixing or the synchronizing ability.

In a tuning apparatus of this invention, a device which functions as a high-band trap during reception of low-band television signals is used as an image trap for high-band signals during reception of high-band television signals. A device which functions as an intermediate-frequency trap during reception of lowband signals is used as a low-band trap during reception of high-band television signals.

According to the present invention, there is provided a tuning apparatus for the VHF band of a television receiver, said apparatus comprising channel selection circuit means, channel interpretation circuit means, a switch section, first trap circuit means, second trap circuit means, a tuning device, third trap circuit means, and a semiconductor switching device. The channel selection circuit means selects signals of a desired frequency from television signals. The channel interpretation circuit means determines whether the signals selected by the channel selection circuit means are low-band or high-band. The switch section has a D.C. power source, and assumes a first switching condition when the channel interpretation circuit means determines that the selected signals are low-band, and a second switching condition when the channel interpretation circuit means determines that the selected signals are high-band. The first trap circuit means receives, at one end, the television signals, and traps the intermediate-frequency components of these television signals. The second trap circuit means is coupled to the other end of the first trap circuit means. The tuning device is coupled to the output terminal of the second trap circuit means, thereby to tune the television signals. The third trap circuit means is coupled to the output terminal of the second trap circuit means and also to the movable contact of the switch section. The semiconductor switching means is connected between the second and third trap circuit means. The switching device is turned on when the switch section assumes the first switching condition. In this case, the second trap circuit means traps the high-band signals, and the third trap circuit means traps the intermediate-frequency signals. The switching device is turned off when the switch section assumes the second switching condition. In this case, the second trap circuit means performs the image-trapping of the high-band signals, and the third trap circuit means traps the low-band signals.

BRIEF DESCRIPTION OF THE DRAWINGS

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

Figure 1:
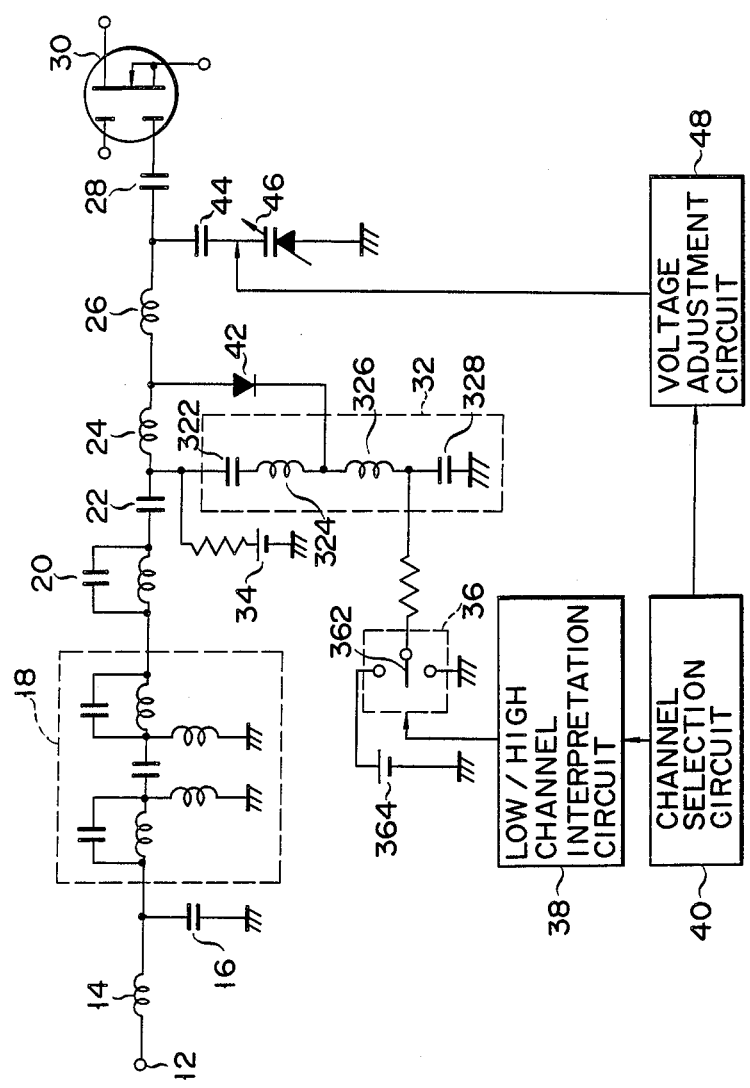
FIG. 1 is a circuit diagram showing an input tuning circuit to which the present invention is applied.

FIG. 1 shows an input tuning circuit to which the present invention is applied.

As is shown in FIG. 1, the input tuning circuit (10) has input terminal 12. The television signals received by an antenna (not shown) or the like are supplied to input terminal 12, and further supplied to intermediate-frequency trap circuit 18 through a low-pass filter comprised of inductor 14 and capacitor 16. The signals are supplied via intermediate-frequency trap circuit 18, image trap circuit 20, coupling capacitor 22, inductors 24 and 26, and coupling capacitor 28 to the field effect transistor 30 of a high-frequency amplifier circuit.

Band trap circuit 32 is connected between the ground and the connection point of coupling capacitor 22 and inductor 24. Similarly, bias circuit 34 is coupled between the ground and the same connection point. Band trap circuit 32 comprises capacitor 322, inductors 324 and 326, and capacitor 328, which are connected in series. Switch section 36 is coupled to the connection point of inductor 326 and capacitor 328, for switching from the low-band to the high-band, or vice versa.

Switch section 36 has movable contact 362 which can moved to connect band trap circuit 32 to D.C. power source 364 or the ground. Movable contact 362 is operated in accordance with whether low/high channel interpretation circuit 38 determines that the television signals are low-band or high-band. Low/high channel interpretation circuit 38 per-forms its function in accordance with the output signal of channel selection circuit 40.

Switching diode 42 is connected between the connection point of inductors 24 and 26 and the connection point of inductors 324 and 326, with its cathode connected to the connection point of inductors 324 and 326, as shown in FIG. 1. A series circuit of capacitor 44 and variable capacitance diode 46 is connected between the ground and the connection point of inductor 26 and capacitor 28. Diode 46 is provided to change the band of a selected channel. Its capacitance is varied when voltage adjustment circuit 48 adjusts a bandswitching voltage in accordance with the output signal of channel selection circuit 40.

The operation of the input tuning circuit shown in FIG. 1 will now be explained.

Channel selection circuit 40 is operated when an external channel switch is operated to receive television signals. Circuit 40 selects the television signals of the channel specified by the operation of the external channel switch. Low/high channel interpretation circuit 38 determines whether these selected signals are low-band or high-band. When the signals selected by channel selection circuit 40 are low-band, movable contact 362 of switch section 36 is moved and coupled to D.C. power source 364. Switching diode 42 is thereby turned off. As a result, band trap circuit 32 operates so as to attenuate the high-band signals. In the meantime, voltage adjustment circuit 48 applies a reverse bias voltage to variable capacitance diode 46, said reverse bias voltage being determined by the desired signal frequency selected by channel selection circuit 40. The tuning capacitance of diode 46 is thereby varied. The inductance of inductor 24 for tuning the low-band channel greatly influences the tuning operation.

The low-band signals are supplied to intermediate-frequency trap circuit 18. Circuit 18 traps intermediate-frequency signals. The low-band signals output from circuit 18 are supplied to band trap circuit 32. Circuit 32 traps high-band signals. The signals output from circuit 32 are input to field effect transistor 30.

On the other hand, when the signals selected by channel selection circuit 40 are high-band, and this fact is determined by low/high channel interpretation circuit 38, movable contact 362 of switch section 36 is moved and coupled to the ground. Switching diode 42 is thereby turned on. Band trap circuit 32 therefore operates, attenuating the low-band signals. In the meantime, voltage adjustment circuit 48 applies the reverse bias voltage to variable capacitance diode 46, as in the case where channel selection circuit 40 selects low-band signals. The tuning capacitance of diode 46 is thus varied. In this case, it is the inductance of inductor 26 for tuning the high-band channel which greatly influences the tuning operation.

The high-band signals are input to intermediate-frequency trap circuit 18. Circuit 18 traps intermediate-frequency signals. The high-band signals output from circuit 18 are supplied to band trap circuit 32. Circuit 32 traps high-band signals. The signals output from circuit 32 are supplied to field effect transistor 30.

In order to receive and correctly process CATV signals, input tuning circuit (FIG. 1) must receive high-band signals over a broader range, and also low-band signals over a broader range. More specifically, the capacitance of variable capacitance diode 46 must be varied to a greater extent, thereby to receive low-band signals of a broader range and high-band signals of a broader range. When diode 46 has a capacitance which is sufficiently large for this purpose, however, capacitors 322 and 328 of band trap circuit 32 must have smaller capacitances. This is because the capacitances of these capacitors 322 and 328 are directly related to that of variable capacitance diode 46 with regard to the function of band trap circuit 32. That is, when the capacitance of diode 46 is greatly changed, without reducing the capacitances of capacitors 322 and 328, the frequency characteristics of the input tuning circuit will be degraded with respect to the passing band. Consequently, it is difficult to broaden the tuning-frequency range of the input tuning circuit.

Figure 2:
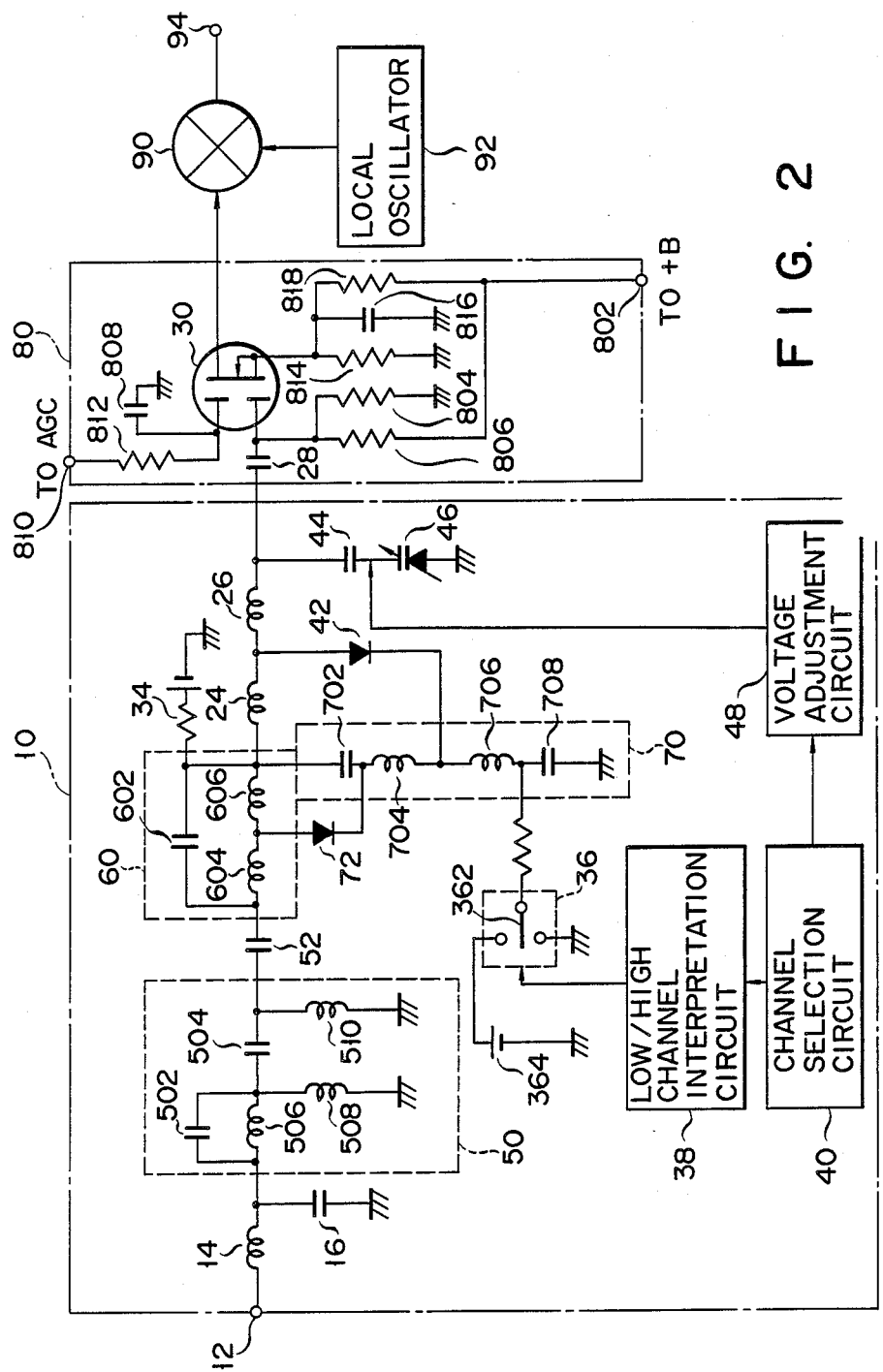
FIG. 2 is a circuit diagram showing the tuning apparatus according to the present invention.

A tuning apparatus according to the invention, which includes an input tuning circuit similar to the one shown in FIG. 1, will now be described with reference to FIG. 2 and FIGS. 3A and 3B. In FIG. 2, the same numerals are used to designate the same elements as those shown in FIG. 1.

As is shown in FIG. 2, input tuning circuit 10 has input terminal 12. The television signals received by an antenna (not shown) or the like are supplied to input terminal 12. Input terminal 12 is connected to intermediate-frequency trap (or, first rap) circuit 50 by a low-pass filter comprised of inductor 14 and capacitor 16.

Intermediate-frequency trap circuit 50 comprises capacitors 502 and 504 forming a series circuit coupled to the output terminal of inductor 14. It further comprises inductor 506 connected in parallel to capacitor 502, inductor 508 connected between the ground and one end of capacitor 504, and inductor 510 connected between the ground and the other end of capacitor 504.

Second trap circuit 60 is connected by coupling capacitor 52 to the output terminal of intermediate-frequency trap circuit 50. Second trap circuit 60 comprises capacitor 602, inductor 604, and inductor 606. Capacitor 602 and inductor 604 are coupled, at one end, to the input terminal of circuit 60. The other end of inductor 604 is coupled to one end of inductor 606, and the other end of capacitor 602 is connected to the other end of inductor 606. Bias circuit 34 is coupled between the output of second trap circuit 60 and the ground.

Third trap circuit 70 is connected to the output of second trap circuit 60. Circuit 70 is a series circuit connected between the output of second trap circuit 60 and the ground and consisting of capacitor 702, inductors 704 and 706, and capacitor 708. Capacitor 702 is coupled to the output of circuit 60, and capacitor 708 is connected to the ground. Switching diode 72 is provided, with its anode coupled to the connection point of inductors 604 and 606 of second trap circuit 60, and its cathode coupled to the connection point of capacitor 702 and inductor 704. This diode 72 is provided for switching from low-band to high-band, or vice versa.

A series circuit of inductor 24 for low-band channel tuning and inductor 26 for high-band channel tuning is connected to the output of second trap circuit 60. Low/high band-switching diode 42 is provided, with its anode coupled to the connection point of inductors 24 and 26, and its cathode coupled to the connection point of inductors 704 and 706 of third trap circuit 70.

Switch section 36 for turning on and off low/high band-switching diodes 42 and 72 is connected the connection point of inductor 706 and capacitor 708 of third trap circuit 70. Switch section 36 has movable contact 362 which can be moved to couple third trap circuit 70 to the ground, either directly or via D.C. power source 364.

A series circuit consisting of capacitor 44 and variable capacitance diode 46 is connected to the output of input tuning circuit 10, i.e., the other end of inductor 26, which is not coupled to diode 42. This serial circuit is used to adjust the tuning frequency of input tuning circuit 10. The tuning capacitance of diode 46 is adjusted by the band-switching voltage applied from voltage adjustment circuit 48. Voltage adjustment circuit 48 operates in accordance with the signal which channel selection circuit 40 outputs when circuit 40 selects television signals.

The output of input tuning circuit 10 is connected to one end of coupling capacitor of high-frequency amplifier circuit 80. The other end of this capacitor 28 is coupled to the first gate of n-type, dual gate, field effect transistor 30 provided for amplifying the high-frequency signal output by input tuning circuit 10. Resistor 804 is coupled between the first gate of transistor 30 and the ground, and resistor 806 is coupled between the first gate and +B power terminal 802. Capacitor 808 is connected between the second gate of transistor 30 and the ground, and resistor 812 is coupled between the second gate and the AGC (Automatic Gain Control) terminal of an AGC circuit (not shown).

The source of field effect transistor 30 is connected to the ground by resistor 814, and also coupled to the ground by capacitor 816. Further, it is connected to power terminal 802 by resistor 818. The drain of field effect transistor 30 is connected to mixer 90 provided for outputting the high-frequency signal amplified by field effect transistor 30.

The high-frequency signal amplified by high-frequency amplifier circuit 80 is input to mixer 90. Also input to mixer 90 is the signal generated by local oscillator 92 (or a local oscillating circuit). The output signal of mixer 90 is supplied from output terminal 94 as an intermediate-frequency signal. The operation of the tuning apparatus of the structure described above will now be described.

Assume that a channel switch (not shown) or the like is operated, thus selecting a desired channel. Then, channel selection circuit 40 supplies the signal, which represents the selected channel, to low/high channel interpretation circuit 38 and voltage adjustment circuit 48. Low/high channel interpretation circuit 38 determines whether the frequency of the signals of the selected channel is low-band or high-band.

When the signals of the selected channel have a low-band frequency, movable contact 362 of switch section 36 is moved and coupled to D.C. power source 364. The voltage at switch section 36 thereby rises. As a result, switching diodes 42 and 72 are opened at a high frequency, thereby changing their resonance frequencies. More specifically, the parallel trap unit, or second trap circuit 60 comprised of inductors 604 and 606 and capacitor 602, functions to trap high-band channel signals, and third trap circuit 70 comprised of capacitors 702 and 708 and inductors 704 and 706 functions as an intermediate-frequency trap.

In order to tune the signals of the channel selected by channel selection circuit 40, the capacitance of variable capacitance diode 46 is varied. That is, voltage adjustment circuit 48 applies a reverse bias to variable capacitance diode 46, thereby changing the tuning capacitance. The signals of the desired frequency, or the signals of the desired channel, can thereby be selected.

Meanwhile, the low-band television signals, which have been selected by operating the channel switch (not shown) or the like, are supplied to input terminal 12. The high-band components of these signals are attenuated by the low-pass filter made of inductor 14 and capacitor 16. Thereafter, these signals are input to intermediate-frequency trap circuit 50. Circuit 50 traps the intermediate-frequency components of the input television signals. In other words, capacitors 502 and 504 and inductors 506, 508 and 510 cooperate to trap the intermediate-frequency components.

The low-band television signals, which now contain no intermediate-frequency components, are input via coupling capacitor 52 to second trap circuit 60. As has been described, second trap circuit 60 functions to trap high-band signals, and third trap circuit 70 functions to trap second intermediate-frequency signals, due to the operations of switching diodes 42 and 72.

The low-band television signals, thus obtained, are amplified by high-frequency amplifier circuit 80 with a predetermined gain. More precisely, every signal output from second trap circuit 60 provided in input tuning circuit 10 is input via inductors 24 and 26 and capacitor 28 to the first gate of field effect transistor 30 of high-frequency amplifier circuit 80. The high-frequency signals input to field effect transistor 30 are amplified by the voltage applied from +B power source terminal 802, and output from the drain of transistor 30. The second gate of field effect transistor 30 is connected to AGC terminal 810, which in turn is coupled to an AGC circuit (not shown). A gate voltage is applied from the AGC circuit to the second gate of transistor 30, so that the high-frequency signal input to the first gate can have the predetermined gain.

The high-frequency signal, thus amplified, is output to mixer 90. Mixer 90 performs heterodyne detection of the signal output from high-frequency amplifier circuit 30 and the signal generated by local oscillator 92, thereby outputting an intermediate-frequency signal. This intermediate-frequency signal is supplied from output terminal 94 to a video intermediate-frequency amplifier (not shown).

It will now be explained how the tuning apparatus operates when it receives high-band television signals. In this case, low/high channel interpretation circuit 38 determines that the frequency of the signals of these signals are high band. Then, movable contact 362 of switch section 36 is moved and coupled to the ground. Switching diodes 42 and 72 are thereby short-circuited at high frequency, and inductors 606 and 704 and capacitor 702 are also short-circuited at a high frequency. As a result, the resonance frequencies of second trap circuit 60 and third trap circuit 70 are changed. More specifically, an image trap for high-band signals is formed in second trap circuit 60, and a trap circuit for low-band signals is formed in third trap circuit 70.

At the same time the desired signals are selected by channel section circuit 40, voltage adjustment circuit 48 applies a reverse bias voltage to variable capacitance diode 46. The capacitance of this diode 48 is thereby changed, so that the high-band signals of the desired channel can be selected.

In the meantime, the high-band television signals, which have been selected by operating the channel switch (not shown) or the like, are supplied to input terminal 12. The high-band components of these high-band signals are attenuated by the low-pass filter. These signals are then input to intermediate-frequency trap circuit 50. Circuit 50 traps the intermediate-frequency components of these television signals.

The high-band television signals, which now contain no intermediate-frequency components, are input via coupling capacitor 52 to second trap circuit 60. As has been explained, second trap circuit 60 functions as an image trap for the high-band signals, and third trap circuit 70 functions to trap the low-band signals, due to the operations of switching diodes 42 and 72.

The high-band television signals output from the trap circuits are input to high-frequency amplifier circuit 80 via capacitor 28. These signals are amplified by circuit 80 in the same way, and the output signal is supplied from output terminal 94 in the same manner, as in the case of receiving the low-band television signals.

Figure 3B:
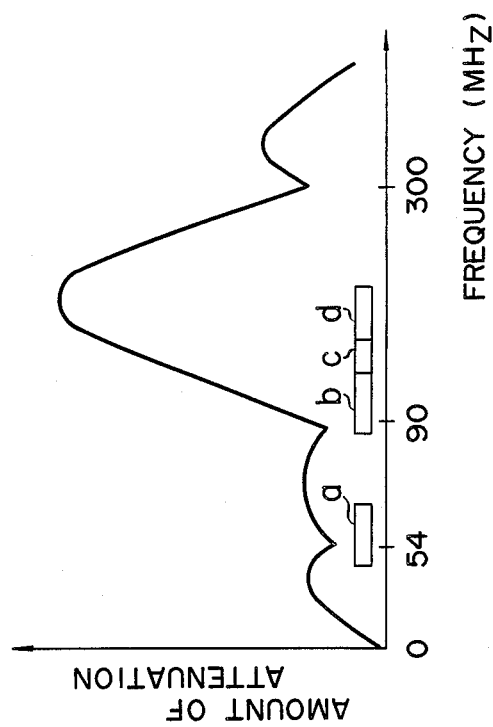
FIGS. 3A and 3B are graphs illustrating the frequency characteristics of the apparatus of FIG. 2, FIG. 3A showing the frequency characteristics which the apparatus exhibits during reception of low-band television signals, and FIG. 3B representing the frequency characteristics which the apparatus exhibits during reception of high-band television signals.
Figure 3A:
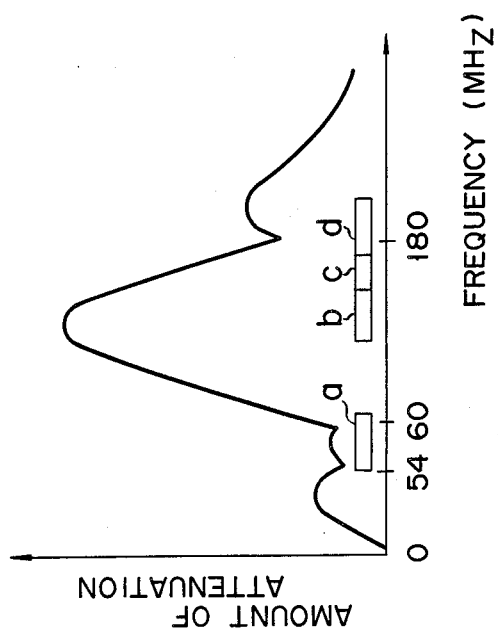

FIGS. 3A and 3B are graphs representing the relationship between the frequency of the signal input to the tuning apparatus and the attenuation of the signal achieved by the tuning apparatus. FIG. 3A shows the frequency-to-attenuation relationship which the apparatus exhibits during the reception of low-band signals. FIG. 3B shows the frequency-to-attenuation relationship which the apparatus exhibits during the reception of high-band signals. In these figures, "a" denotes an intermediate frequency (e.g., 58.75 MHz), "b" represents low-band frequency range (e.g., 90 to 108 MHz), "c" designates mid-band frequency range (e.g., 108 to 170 MHz), and "d" denotes high-band frequency range (e.g., 170 to 222 MHz).

As can be understood from FIG. 3A, intermediate-frequency trap circuit 50 and third trap circuit 70 function as an intermediate-frequency trap during the reception of the low-band television signals. Therefore, two frequency components of each signal, whose frequencies fall within intermediate-frequency range a, are trapped. In addition, second trap circuit 60 traps one frequency component of the signal, whose frequency falls within high-band frequency range d. Hence, an excellent low-band signal can be obtained.

As can be seen from FIG. 3B, only intermediate-frequency trap circuit 50 functions as an intermediate-frequency trap during the receipt of the high-band television signals. Therefore, only one frequency component of each signal, whose frequency falls within intermediate-frequency range a, is trapped. Further, third trap circuit 70 functions to trap low-band signals during reception of the high-band television signals. Hence, the intermediate-frequency component and low-band component of the signal are trapped. As a result, an excellent high-band signal can be obtained.

Furthermore, second trap circuit 60 functions as a high-band image trap circuit during reception of the high-band television signals. In other words, circuit 60 traps the image frequency which is about 100 MHz higher than that of the highest frequency component of the high-band television signal. Not only the low-band component, but also the high-band component, i.e., the image-frequency component, can be trapped. Hence, an excellent high-band signal can be obtained.

Second trap circuit 60 does not function as a high-band image trap circuit during reception of the low-band television signals for the following reason. The image frequency of a low-band signal falls within the high-band frequency region. Thus, intermediate-frequency trap circuit 50 and second trap circuit 60 cooperate to trap both the high-band component and low-band image frequency component of the high-band signal.

As has been described, second trap circuit 60 provided in input tuning circuit 10 functions as an intermediate-frequency trap during reception of the low-band television signals, and as a low-band trap during reception of the high-band television signals. It is therefore unnecessary to greatly change the capacitance of variable capacitance diode 46 in order to obtain an excellent high-band television signal. The tuning apparatus of this invention can tune television signals of any band, only by switching the trap circuits.

Thus, the capacitances of capacitors 702 and 708 provided in third trap circuit 70 need not be reduced; they can be of relatively large values. It follows that the capacitance of variable capacitance diode 46, which is provided for adjusting the tuning frequency, can be small, and the tuning apparatus has but a small power loss. Hence, the tuning apparatus can greatly attenuate all components of each input signal other than the component of the desired band. Input tuning circuit 10 can therefore efficiently prevent mixing of signals, and can accurately select signals of the desired band. Further, third trap circuit 70 can perform its function even if inductances of inductors 704 and 706 are greatly changed. Thus, the tuning apparatus of the invention can be used in combination with any kind of an antenna merely by changing the inductances of these inductors 704 and 706.

As has been described above, the tuning apparatus according to the present invention can prevent signal-mixing even if the tuning frequency is adjusted over a broad range, and can be used in combination with any kind of an antenna.

What is claimed is:

1. A tuning apparatus for the VHF band of a television receiver, said apparatus comprising:
   channel selection circuit means for selecting signals of a desired frequency from television signals;
   channel interpretation circuit means for determining whether the signals selected by said channel selection circuit means are low-band or high-band;
   switch section having a D.C. power source and assuming a first switching condition when said channel interpretation circuit means determines that the selected signals are low-band, and a second switching condition when said channel interpretation circuit means determines that the selected signals are high-band;
   first trap circuit means for receiving, at one end, the television signals and trapping the intermediate-frequency components of these signals;
   second trap circuit means coupled to the other end of said first trap circuit means;
   a tuning device coupled to the output terminal of said second trap circuit means, for tuning the television signals;
   third trap circuit means coupled to the output terminal of said second trap circuit means and also to a movable contact of said switch section; and
   a semiconductor switching device connected between said second trap circuit means and said third trap circuit means, said semiconductor switching device being turned on when said switch section assumes the first switching condition, thereby to cause said second trap circuit means to trap high-band television signals and said third trap circuit means to trap intermediate-frequency television signals, and being turned off when said switch section assumes the second switching condition, thereby to cause said second trap circuit means to perform the image trapping of high-band television signals and said third trap circuit means to trap low-band television signals.

2. A tuning apparatus according to claim 1, wherein said semiconductor switching device uses a switching diode.

3. A tuning apparatus according to claim 2, wherein said second trap circuit means comprises a capacitor connected between the input and output terminals of said second trap circuit means, at least two inductors connected in series to each other, thus forming a serial circuit connected in parallel to said capacitor, and a bias circuit coupled between the output terminal and the ground; said third trap circuit means is coupled between the output terminal of said second trap circuit means and the ground and comprises a capacitor, at least two inductors and a capacitor which are connected in series; and said tuning device comprises a variable capacitance diode.

4. A tuning apparatus according to claim 3, further comprising voltage adjustment means for changing the capacitance of said variable capacitance diode in accordance with the signals of the frequency selected by said channel selection circuit means, thereby to perform tuning.

5. A tuning apparatus according to claim 1, further comprising:
input tuning circuit means including said channel selection circuit means, said channel interpretation circuit means, said switch section, said first trap circuit means, said second trap circuit means, said tuning device, said third trap circuit means, and said semiconductor switching device;
high-frequency amplifier circuit means coupled to said input tuning circuit means, for amplifying the tuned television signals with a predetermined gain;
local oscillating means for generating signals; and
mixer means for detecting the television signals amplified by said high-frequency amplifier circuit means and the signals generated by said local oscillating means, thereby to generate predetermined intermediate-frequency signals.

6. A tuning apparatus according to claim 5, wherein said high-frequency amplifier circuit means uses a field effect transistor having two gates.

7. A tuning apparatus according to claim 5, wherein said local oscillating means uses a local oscillator.

* * * * *